(12) United States Patent
Fujiwara et al.

(10) Patent No.: US 11,382,230 B2
(45) Date of Patent: Jul. 5, 2022

(54) ELECTRONIC APPARATUS, IMAING APPARATUS, AND MOBILE BODY

(71) Applicant: KYOCERA Corporation, Kyoto (JP)

(72) Inventors: Masaki Fujiwara, Yokohama (JP); Hiroshi Nakao, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 3 days.

(21) Appl. No.: 17/041,617

(22) PCT Filed: Mar. 13, 2019

(86) PCT No.: PCT/JP2019/010309
§ 371 (c)(1),
(2) Date: Sep. 25, 2020

(87) PCT Pub. No.: WO2019/188300
PCT Pub. Date: Oct. 3, 2019

(65) Prior Publication Data
US 2021/0014994 A1 Jan. 14, 2021

(30) Foreign Application Priority Data
Mar. 27, 2018 (JP) .............................. JP2018-060744

(51) Int. Cl.
*H05K 7/04* (2006.01)
*H05K 7/20* (2006.01)
(Continued)

(52) U.S. Cl.
CPC ............. *H05K 7/04* (2013.01); *H04N 5/2252* (2013.01); *H05K 7/2039* (2013.01); *H05K 9/0037* (2013.01)

(58) Field of Classification Search
CPC ... H01L 21/8221; H01L 25/0657; H05K 7/04; H05K 7/2039; H05K 9/0037;
(Continued)

(56) References Cited

U.S. PATENT DOCUMENTS 5,438,482 A 8/1995 Nakamura et al.
5,581,443 A * 12/1996 Nakamura ............ H01L 23/585
257/E23.09
(Continued)

FOREIGN PATENT DOCUMENTS

EP 3163864 A1 5/2017
EP 3249905 A1 11/2017
(Continued)

*Primary Examiner* — Adam B Dravininkas
(74) *Attorney, Agent, or Firm* — Studebaker & Brackett PC

(57) ABSTRACT

An electronic apparatus includes a first circuit board, a second circuit board, one or more electronic components, an enclosure portion, and a second housing. The electronic components are mounted on at least one of opposing surfaces of the first circuit board and the second circuit board that oppose each other. The enclosure portion supports a surface of each of the first circuit board and the second circuit board to oppose each other with a predetermined gap therebetween. The enclosure portion encloses a gap space that includes the one or more electronic components within a space between the first circuit board and the second circuit board. The second housing accommodates the first circuit board, the second circuit board, and the enclosure portion. The enclosure portion contacts the housing.

8 Claims, 14 Drawing Sheets

(51) Int. Cl.
*H05K 9/00* (2006.01)
*H04N 5/225* (2006.01)

(58) Field of Classification Search
CPC .. H05K 1/144; H05K 1/181; H05K 2201/042; H05K 1/0298; H05K 2201/10371; H05K 9/0033; H05K 7/20963; G06F 1/203; G06F 1/1626; G06F 1/1656
See application file for complete search history.

(56) References Cited

U.S. PATENT DOCUMENTS

| | | | | |
|---|---|---|---|---|
| 5,586,388 | A * | 12/1996 | Hirao | H05K 1/144 |
| | | | | 257/E23.068 |
| 5,740,527 | A * | 4/1998 | Mitama | H04B 1/3827 |
| | | | | 361/818 |
| 2008/0130234 | A1* | 6/2008 | Maehara | H05K 7/205 |
| | | | | 361/704 |
| 2011/0199748 | A1* | 8/2011 | Kagawa | H05K 7/20436 |
| | | | | 361/796 |
| 2011/0205701 | A1* | 8/2011 | Kanzaki | F16H 59/72 |
| | | | | 361/689 |
| 2015/0288892 | A1 | 10/2015 | Frank et al. | |
| 2016/0270261 | A1* | 9/2016 | Matsuda | H05K 7/20445 |
| 2017/0320449 | A1* | 11/2017 | Park | B60R 11/04 |
| 2018/0233930 | A1* | 8/2018 | Chiyajo | H01M 10/482 |
| 2019/0277296 | A1* | 9/2019 | Okada | F04D 19/04 |
| 2020/0027866 | A1* | 1/2020 | Nagasawa | H01L 23/5385 |

FOREIGN PATENT DOCUMENTS

| | | |
|---|---|---|
| JP | H07-45982 A | 2/1995 |
| JP | 2000-196266 A | 7/2000 |
| JP | 2014-036066 A | 2/2014 |
| KR | 10-2014-0059181 A | 5/2014 |
| WO | 2015/025687 A1 | 2/2015 |

* cited by examiner

ELECTRONIC APPARATUS, IMAGING APPARATUS, AND MOBILE BODY

CROSS REFERENCE TO RELATED APPLICATION

This application claims priority to Japanese Patent Application No. 2018-060744 filed on Mar. 27, 2018, the entire contents of which are incorporated herein by reference.

TECHNICAL FIELD

The present disclosure relates to an electronic apparatus, an imaging apparatus, and a mobile body.

BACKGROUND

It is conventionally known to provide a heat absorbing member on an electronic component in order to release heat generated by the electronic component mounted on a circuit board (e.g., PTL 1).

CITATION LIST

Patent Literature

PTL 1: JP 2014-036066 A

SUMMARY

An electronic apparatus according to an embodiment of the present disclosure includes a first circuit board, a second circuit board, one or more electronic components, an enclosure portion, and a housing. The one or more electronic components are mounted on at least one of opposing surfaces of the first circuit board and the second circuit board that oppose each other. The enclosure portion supports a surface of each of the first circuit board and the second circuit board to oppose each other with a predetermined gap therebetween. The enclosure portion encloses a gap space that includes the one or more electronic components within a space between the first circuit board and the second circuit board. The housing accommodates the first circuit board, the second circuit board, and the enclosure portion. The enclosure portion contacts the housing.

An imaging apparatus according to an embodiment of the present disclosure includes an electronic apparatus. The electronic apparatus includes a first circuit board, a second circuit board, one or more electronic components, an enclosure portion, and a housing. The one or more electronic components are mounted on at least one of opposing surfaces of the first circuit board and the second circuit board that oppose each other. The enclosure portion supports a surface of each of the first circuit board and the second circuit board to oppose each other with a predetermined gap therebetween. The enclosure portion encloses a gap space that includes the one or more electronic components within a space between the first circuit board and the second circuit board. The housing accommodates the first circuit board, the second circuit board, and the enclosure portion. The enclosure portion contacts the housing.

A mobile body according to an embodiment of the present disclosure includes an electronic apparatus. The electronic apparatus includes a first circuit board, a second circuit board, one or more electronic components, an enclosure portion, and a housing. The one or more electronic components are mounted on at least one of opposing surfaces of the first circuit board and the second circuit board that oppose each other. The enclosure portion supports a surface of each of the first circuit board and the second circuit board to oppose each other with a predetermined gap therebetween. The enclosure portion encloses a gap space that includes the one or more electronic components within a space between the first circuit board and the second circuit board. The housing accommodates the first circuit board, the second circuit board, and the enclosure portion. The enclosure portion contacts the housing.

BRIEF DESCRIPTION OF THE DRAWINGS

FIG. 3 is a perspective view illustrating an enclosure portion illustrated in

FIG. 2;

DETAILED DESCRIPTION

With the increased performance of apparatuses having electronic components mounted therein, it is necessary for apparatuses to house a plurality of substrates having respective electronic components mounted thereon. However, providing a heat absorbing member to each of the electronic components mounted on the plurality of substrates increases the number of elements and hinders miniaturization of the apparatuses.

The present disclosure aims to provide an electronic apparatus, an imaging apparatus, and a mobile body that can be downsized while maintaining effective heat dissipation.

Hereinafter, an imaging apparatus 10 according to a first embodiment of the present disclosure will be described with reference to the drawings.

Figure 1:
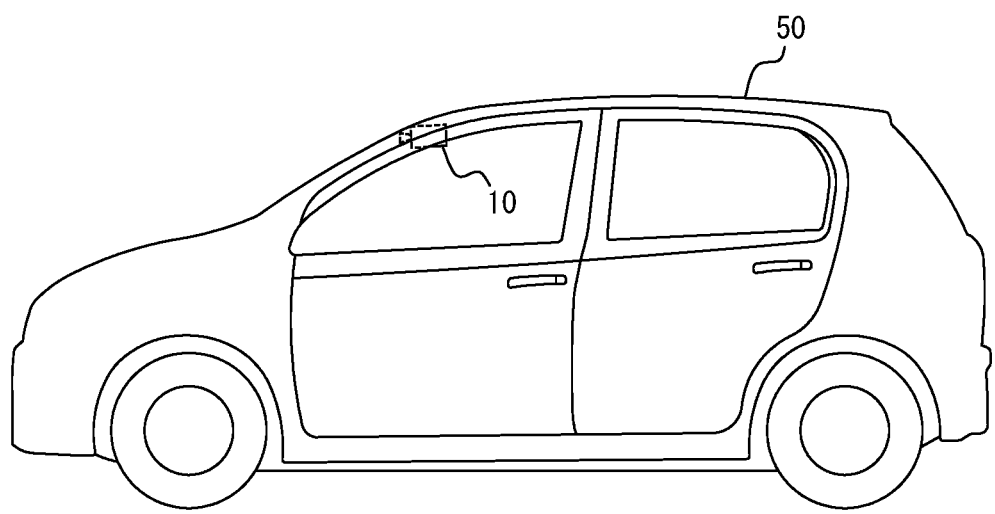
FIG. 1 is a schematic diagram illustrating a mobile body equipped with an imaging apparatus that includes an electronic apparatus illustrated in FIG. 1.

As illustrated in FIG. 1, the imaging apparatus 10 may be mounted on a mobile body 50 in a manner so as to be able to image a scene surrounding the mobile body 50. The mobile body 50 may encompass, for example, vehicles, ships, and aircrafts. Vehicles may include, for example, automobiles, industrial vehicles, rail vehicles, domestic vehicles, and fixed-wing aircrafts that travel on a runway. Automobiles may include, for example, cars, trucks, buses, motorcycles, and trolley buses. Industrial vehicles may include, for example, agricultural vehicles and construction vehicles. Industrial vehicles may include, for example, forklifts and golf carts. Industrial vehicles for agricultural purpose may include, for example, tractors, tillers, transplanters, binders, combined harvesters, and lawn mowers. Industrial vehicles for construction purpose may include, for example, bulldozers, scrapers, excavators, crane trucks, dump trucks, and load rollers. Vehicles may include human-powered vehicles that travel on human power. Classification of the vehicles is not limited to the above. For example, vehicles may include industrial vehicles authorized to travel on the road. A plurality of categories may include the same type of vehicles. Vessels may include, for example, watercraft, boats, and tankers. Aircraft may include, for example, fixed wing aircraft and rotorcraft.

Figure 2:
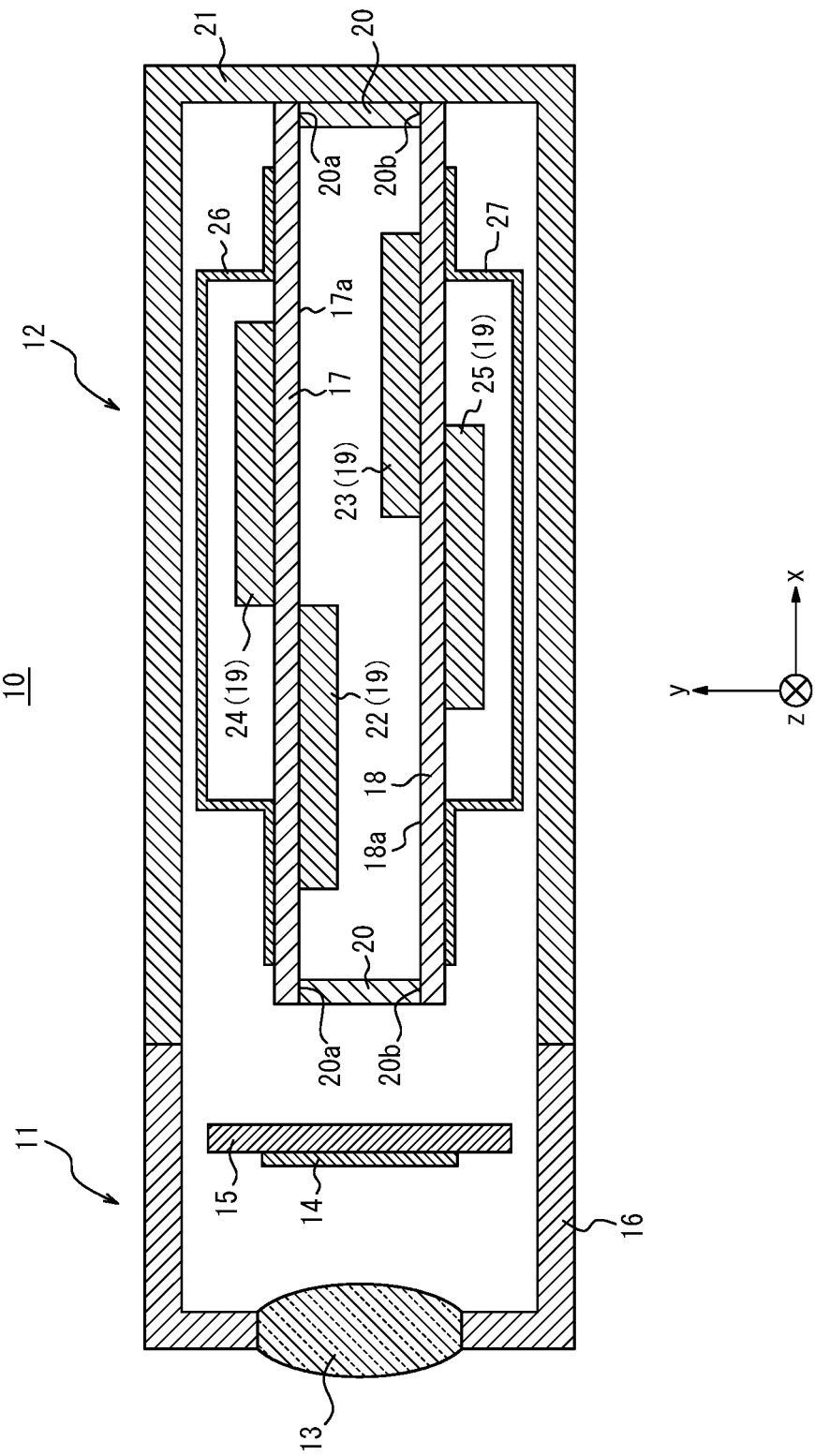
FIG. 2 is a cross-sectional view illustrating an imaging apparatus that includes an electronic apparatus according to a first embodiment.

As illustrated in FIG. 2, the imaging apparatus 10 includes a first electronic apparatus 11 and a second electronic apparatus (electronic apparatus) 12. In the following description, an optical axis direction of a lens, which will be described later, will be referred to as an x-direction, a normal direction of a first circuit board 17 and a second circuit board 18, which will be described later, will be referred to as a y-direction, and a direction perpendicular to the x-direction and the y-direction will be referred to as an x-direction.

The first electronic apparatus 11 includes an imaging optical system 13, an image sensor 14, an image sensor substrate 15, and a first housing 16.

The imaging optical system 13 includes one or more lenses. The imaging optical system 13 is fixed to the first housing 16 such that an optical axis OX of the imaging optical system 13 is perpendicular to an imaging surface of the image sensor 14. The imaging optical system 13 forms light incident from a subject as a subject image on the imaging surface of the image sensor 14.

The image sensor 14 generates an image including the subject image formed on the imaging surface by the imaging optical system 13. The image sensor 14 is, for example, a CMOS (Complementary Metal Oxide Semiconductor) image sensor or a CCD (Charge Coupled Device). The image sensor 14 is mounted on the image sensor substrate 15.

The image sensor substrate 15 is a plate-like member. The image sensor substrate 15 has the image sensor 14 and the like mounted thereon.

The first housing 16 houses the imaging optical system 13 and the image sensor substrate 15 having the image sensor 14 mounted thereon.

The second electronic apparatus 12 performs image processing on the image generated by the first electronic apparatus 11. The second electronic apparatus 12 may send a signal to the first electronic apparatus 11, based on the image processing. The second electronic apparatus 12 includes a first circuit board 17, a second circuit board 18, electronic components 19, an enclosure portion 20, and a second housing (housing) 21. The second electronic apparatus 12 may further include a first shield portion 26 and a second shield portion 27.

The first circuit board 17 and the second circuit board 18 are plate-like members. The first circuit board 17 and the second circuit board 18 are arranged such that respective surfaces of each oppose each other in parallel.

The electronic components 19 are components constituting an electronic circuit. The electronic component 19 include, for example, resistors, capacitors, diodes, or an integrated circuit including these elements.

The electronic components 19 include at least one of a first electronic component 22 and a second electronic component 23. The electronic components 19 may include a third electronic component 24 and a fourth electronic component 25. At least one of the electronic components 19 is mounted on at least one of a first opposing surface 17a and a second opposing surface 18a, which will be described later. The first electronic component 22 is mounted on the first opposing surface 17a of the first circuit board 17. The second electronic component 23 is mounted on the second opposing surface 18a of the second circuit board 18. The first electronic component 22 and the second electronic component 23 are arranged within the second electronic apparatus 12 in a manner so as to not interfere with each other.

The third electronic component 24 may be mounted on a surface of the first circuit board 17 which is opposite from the first opposing surface 17a. The fourth electronic component 25 may be mounted on a surface of the second circuit board 18 which is opposite from the second opposing surface 18a.

The enclosure portion 20 supports the first circuit board 17 and the second circuit board 18 such that one surface of the first circuit board 17 and one surface of the second circuit board 18 oppose each other with a predetermined gap therebetween. The enclosure portion 20 encloses a space that includes the first electronic component 22 and the second electronic component 23 within a space between the first circuit board 17 and the second circuit board 18.

Figure 3:
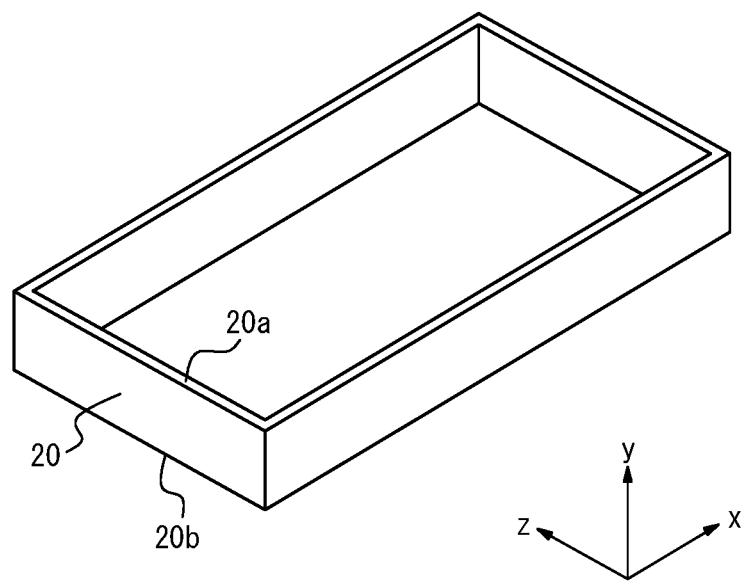

The enclosure portion 20 is, for example, a tubular member as illustrated in FIG. 3. In particular, the enclosure portion 20 has a rectangular tube shape that frames a rectangular flat plate. The enclosure portion 20 may be formed by a single member in which a plurality of flat plates are integrally formed. The enclosure portion 20 may be formed by a member in which a plurality of members are fixed to one another. In the present embodiment, the enclosure portion 20 is formed by a single member.

As illustrated in FIG. 2, the enclosure portion 20 fixes the first circuit board 17 and the second circuit board 18 at end portions thereof in an axial direction (the y-direction in FIG. 2). For example, the enclosure portion 20 fixes peripheral edge portions of the first opposing surface 17a of the first circuit board 17 at end surfaces 20a arranged in the axial direction (the y-direction in FIG. 2) of the rectangular tube. The first opposing surface 17a is a surface of the first circuit board 17 that opposes the second circuit board 18. The enclosure portion 20 is fixed to peripheral edge portions of the second opposing surface 18a of the second circuit board 18 at end surfaces 20b arranged in the axial direction (the y-direction in FIG. 2) of the rectangular tube. The second opposing surface 18a is a surface of the second circuit board 18 that opposes the first circuit board 17.

The enclosure portion 20 fixes the first circuit board 17 and the second circuit board 18 via an adhesive, soldering, a screw, or the like. As a result, the enclosure portion 20 supports the first circuit board 17 and the second circuit board 18 with a predetermined gap therebetween. The predetermined gap corresponds to an axial length of the enclosure portion 20.

The enclosure portion 20 may have heat conductivity. The enclosure portion 20 may have electrical conductivity. For example, the enclosure portion 20 may be formed from a metal material. The enclosure portion 20 may be grounded to the ground of at least one of the first circuit board 17 and the second circuit board 18.

The first shield portion 26 can improve the electromagnetic compatibility (EMC) of the third electronic component 24. The first shield portion 26 shields the third electronic component 24 and can be fixed to the first circuit board 17. The second shield portion 27 can improve the electromagnetic compatibility of the fourth electronic component 25. The second shield portion 27 shields the fourth electronic component 25 and can be fixed to the second circuit board 18. Each of the first shield portion 26 and the second shield portion 27 is formed from a conductive material.

The second housing 21 houses the first circuit board 17 having the first electronic component 22 mounted thereon, the second circuit board 18 having the second electronic component 23 mounted thereon, and the enclosure portion 20 supporting the first circuit board 17 and the second circuit board 18. The second housing 21 contacts at least a part of the enclosure portion 20 and fixes the enclosure portion 20 housed within the second housing 21. The second housing 21 may have a fitting structure to fix the enclosure portion 20.

Figure 4:
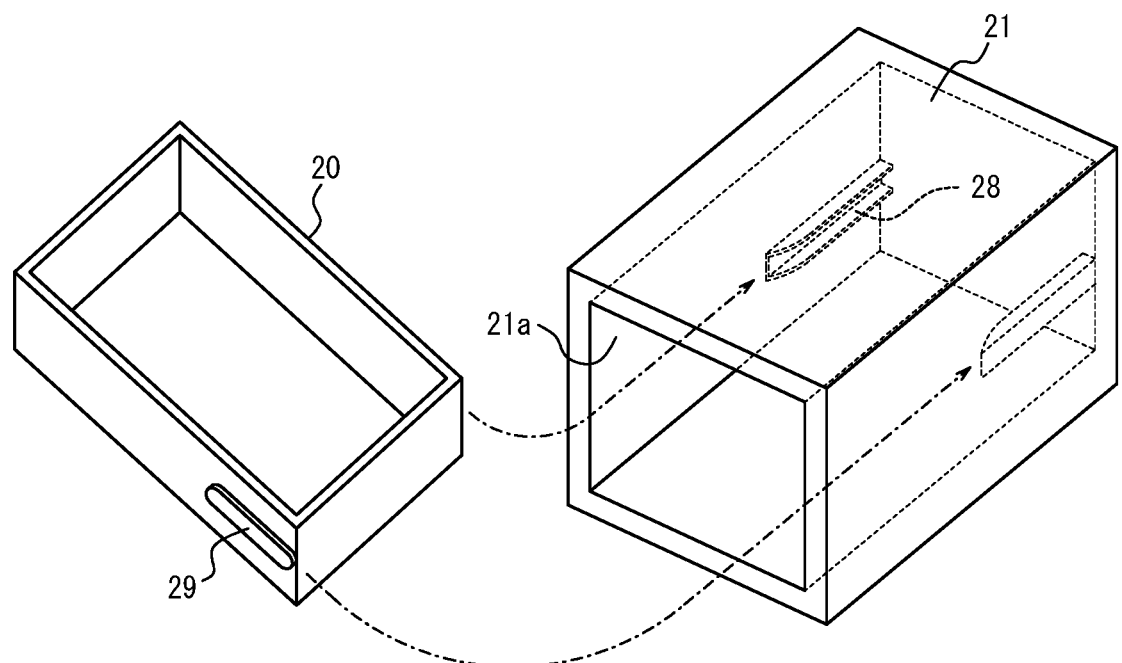
FIG. 4 is an exploded perspective view illustrating an example of the electronic apparatus illustrated in FIG. 2.

In one example as illustrated in FIG. 4, the second housing 21 includes guide portions 28 provided on the inner wall surface 21*a*. The enclosure portion 20 has external surfaces provided with fitting portions 29 to be fitted into the guide portions 28. In a manufacturing process, when the enclosure portion 20 supporting the first circuit board 17 and the second circuit board 18 as described above is inserted into the second housing 21, the fitting portions 29 are guided by the guide portions 28, and thus the enclosure portion 20 is housed within the second housing 21.

Figure 5:
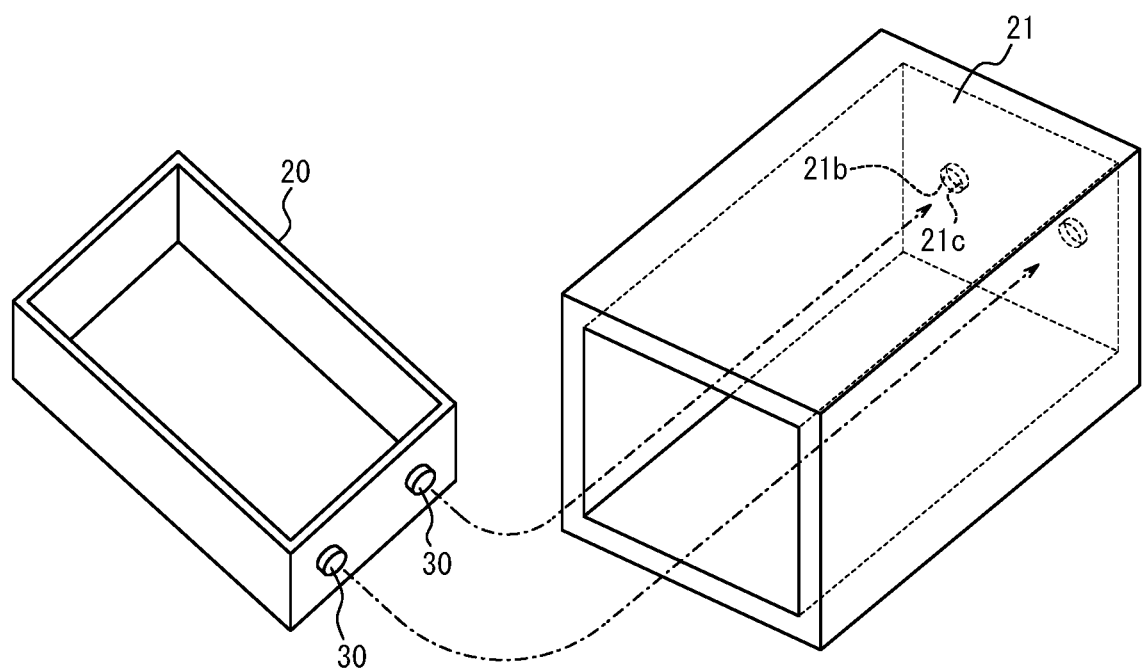
FIG. 5 is an exploded perspective view illustrating another example of the electronic apparatus illustrated in FIG. 2.

In another example as illustrated in FIG. 5, the second housing 21 has opening walls 21*b* formed in the second housing 21. The enclosure portion 20 has protrusions 30 to be fitted into openings 21*c* defined by the opening walls 21*b*. In the manufacturing process, when the enclosure portion 20 supporting the first circuit board 17 and the second circuit board 18 as described above is inserted into the second housing 21, the protrusions 30 are fitted into the openings 21*c*, and thus the enclosure portion 20 is housed within the second housing 21.

According to the first embodiment, as described above, at least one of the electronic components 19 is mounted on at least one of the first opposing surface 17*a* and the second opposing surface 18*a*. Also, the enclosure portion 20 contacts the second housing 21 and, simultaneously, encloses a space that includes one or more of the electronic components 19 within the space between the first circuit board 17 and the second circuit board 18. In the second electronic apparatus 12, thus, the enclosure portion 20 can absorb heat generated by the electronic components 19 and dissipate the heat to the outside via the second housing 21. As a result, the second electronic apparatus 12 can improve the heat dissipation effectiveness for heat generated by the electronic components 19. Further, because the second electronic apparatus 12 requires fewer components than a case in which respective heat absorbing members are provided to the electronic components 19 mounted on the two circuit boards, the second electronic apparatus 12 can be miniaturized.

According to the first embodiment, in the second electronic apparatus 12 the enclosure portion 20 has electrical conductivity and is grounded to the ground of at least one of the first circuit board 17 and the second circuit board 18. In the second electronic apparatus 12, thus, the enclosure portion 20 can improve the electromagnetic compatibility of the electronic components 19.

According to the first embodiment, also, in the second electronic apparatus 12 the third electronic component 24 is mounted on the surface of the first circuit board 17 which is opposite from the first opposing surface 17*a*. In the second electronic apparatus 12, further, the first shield portion 26 that can be fixed to the enclosure portion 20 shields the third electronic component 24. As a result, the second electronic apparatus 12 can allow mounting of more electronic components 19 without increasing the number of circuit boards and further reduce leakage of electromagnetic waves generated by the electronic components 19. Thus, the second electronic apparatus 12 can improve electromagnetic wave suppression effectiveness and suppress a size increase thereof while allowing the mounting of many electronic components 19.

Next, an imaging apparatus 100 according to a second embodiment of the present disclosure will be described. The second embodiment will be described below, focusing on its features which differ from those of the first embodiment. Components having the same configurations as those of the first embodiment are denoted by the same reference numerals.

Figure 6:
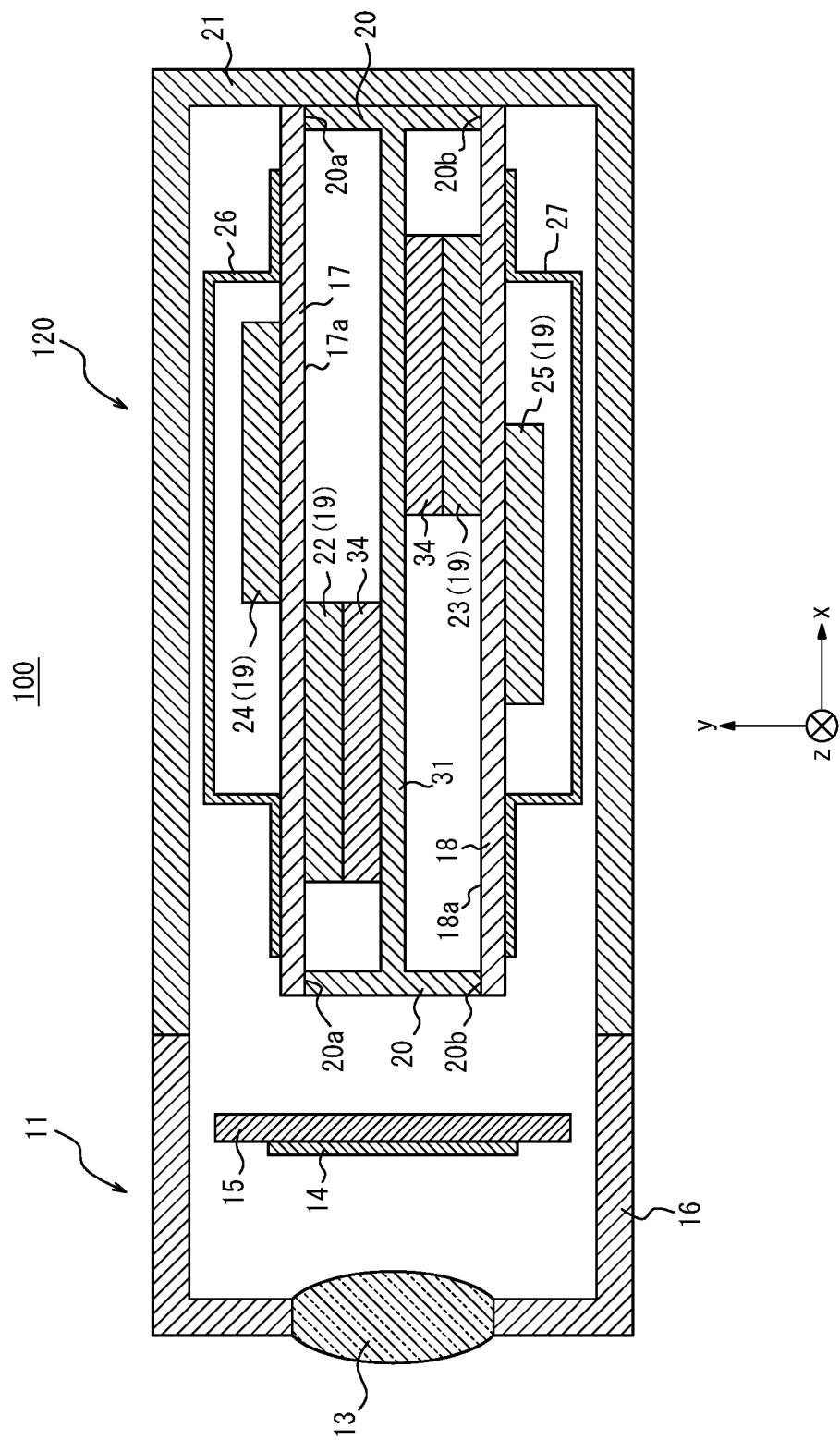
FIG. 6 is a cross-sectional view illustrating an imaging apparatus that includes an electronic apparatus according to a second embodiment.

As illustrated in FIG. 6, the imaging apparatus 100 includes the first electronic apparatus 11 and a second electronic apparatus (electronic apparatus) 120. The first electronic apparatus 11 has the same structure and function as those of the first embodiment.

The second electronic apparatus 120 includes the first circuit board 17, the second circuit board 18, electronic components 19, the enclosure portion 20, and the second housing 21. The structures and functions of the first circuit board 17, the second circuit board 18, the electronic components 19, the enclosure portion 20, and the second housing 21 of the second electronic apparatus 120 are the same as those of the first embodiment. The second electronic apparatus 120 further includes a partition wall 31.

Figure 7:
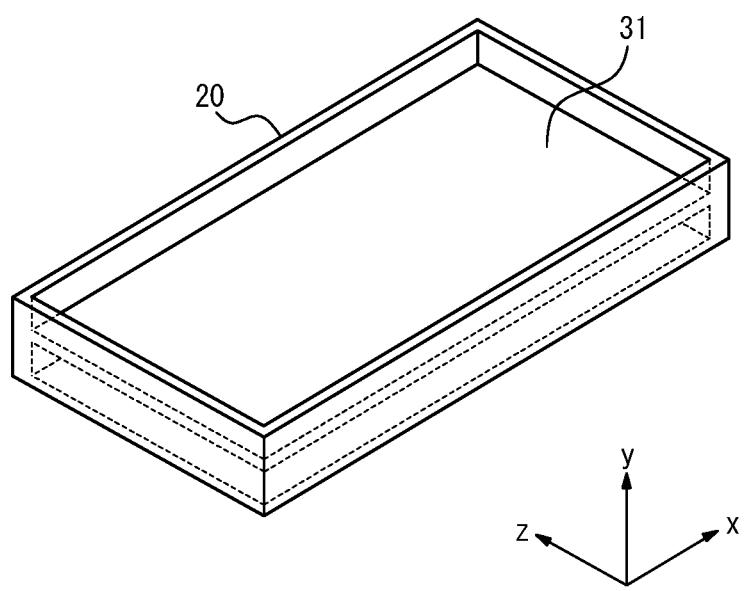
FIG. 7 is a perspective view illustrating an enclosure portion and a partition wall illustrated in FIG. 6.

As illustrated in FIG. 7, the partition wall 31 is, for example, a plate-like member. In particular, the partition wall 31 has a rectangular shape. As illustrated in FIG. 6, the partition wall 31 partitions a space between the first circuit board 17 and the second circuit board 18 into a space that includes the first electronic component 22 and a space that includes the second electronic component 23. The partition wall 31 may be formed by a single member that is integrally formed with the enclosure portion 20. The partition wall 31 may be configured to be a member separate from the enclosure portion 20 and fixed to the enclosure portion 20.

In particular, the partition wall 31 is integrally formed with the enclosure portion 20 at any portion between both ends in the axial direction of the enclosure portion 20, as illustrated in FIG. 6 and FIG. 7. Although in the example illustrated in FIG. 6 the partition wall 31 is integrally formed at a portion including a midpoint of the end surface 20*a* and the end surface 20*b*, this is not restrictive. The partition wall 31 may be integrally formed at any portion between both ends of the enclosure portion 20.

The partition wall 31 may have heat conductivity. The partition wall 31 may have electrical conductivity. For example, the partition wall 31 may be formed from a metal material. The partition wall 31 may directly contact at least one of the first electronic component 22 and the second electronic component 23. Also, the partition wall 31 may indirectly contact at least one of the first electronic component 22 and the second electronic component 23 via a heat conductor 34.

According to the second embodiment, as described above, in the second electronic apparatus 120 at least one of the electronic components 19 is provided on at least one of the first opposing surface 17a and the second opposing surface 18a, in the same manner as the first embodiment. In the second electronic apparatus 120, also, the enclosure portion 20 contacts the second housing 21 and, simultaneously, encloses the space that includes one or more of the electronic components 19 within the space between the first circuit board 17 and the second circuit board 18. Thus, the second electronic apparatus 120 can improve heat dissipation effectiveness for heat generated by the electronic components 19. Further, the second electronic apparatus 120 can improve the heat dissipation effectiveness with fewer elements than that of a case in which a heat absorbing member is provided for each of the electronic components 19 mounted on the two circuit boards.

According to the second embodiment, in the second electronic apparatus 120 the partition wall 31 partitions the space between the first circuit board 17 and the second circuit board 18 into the space that includes the first electronic component 22 and the space that includes the second electronic component 23. Thus, in the second electronic apparatus 120 the partition wall 31 can suppress the conduction of heat generated by the first electronic component 22 to the second electronic component 23 and enable heat dissipation to the outside of the second housing 21 via the enclosure portion 20. In the second electronic apparatus 120, also, the partition wall 31 can suppress the conduction of heat generated by the second electronic component 23 to the first electronic component 22 and enable heat dissipation to the outside of the second housing 21 via the enclosure portion 20. As a result, the second electronic apparatus 120 can further improve the heat dissipation effectiveness. In the second electronic apparatus 120, further, the partition wall 31 shields both electromagnetic waves that are generated by the first electronic component 22 and propagate towards the second electronic component 23 and electromagnetic waves that are generated by the second electronic component 23 and propagate towards the first electronic component 22. Accordingly, the second electronic apparatus 120 can improve electromagnetic compatibility of each of the first electronic component 22 and the second electronic component 23.

According to the second embodiment, in the second electronic apparatus 120 the partition wall 31 directly or indirectly contacts the first electronic component 22. In the second electronic apparatus 120, thus, the partition wall 31 conducts the heat generated from the first electronic component 22 to the second housing 21 in contact with the partition wall 31, for heat dissipation. Thus, the second electronic apparatus 120 can more efficiently conduct heat to the second housing 21 than a case in which the first electronic component 22 does not contact the partition wall 31, and thus improve the heat dissipation effect.

According to the second embodiment, the second electronic apparatus 120 further includes the heat conductors 34 in contact with the partition wall 31 and the electronic components 19. The first electronic component 22 and the second electronic component 23 may not necessarily contact the partition wall 31. On the other hand, in the second electronic apparatus 120 having the configuration described above, at least one of the first electronic component 22 and the second electronic component 23 that may not necessarily come into direct contact with the partition wall 31 contacts the partition wall 31 via the heat conductor 34. In the second electronic apparatus 120, thus, the heat conductors 34 can efficiently conduct heat generated from at least one of the first electronic component 22 and the second electronic component 23 via the partition wall 31. Accordingly, the second electronic apparatus 120 can efficiently dissipate heat generated by at least one of the first electronic component 22 and the second electronic component 23.

Next, an imaging apparatus 101 according to a third embodiment of the present disclosure will be described. The third embodiment will be described below, focusing on its features which differ from those of the first embodiment. Components having the same configurations as those of the first embodiment are denoted by the same reference numerals.

Figure 8:
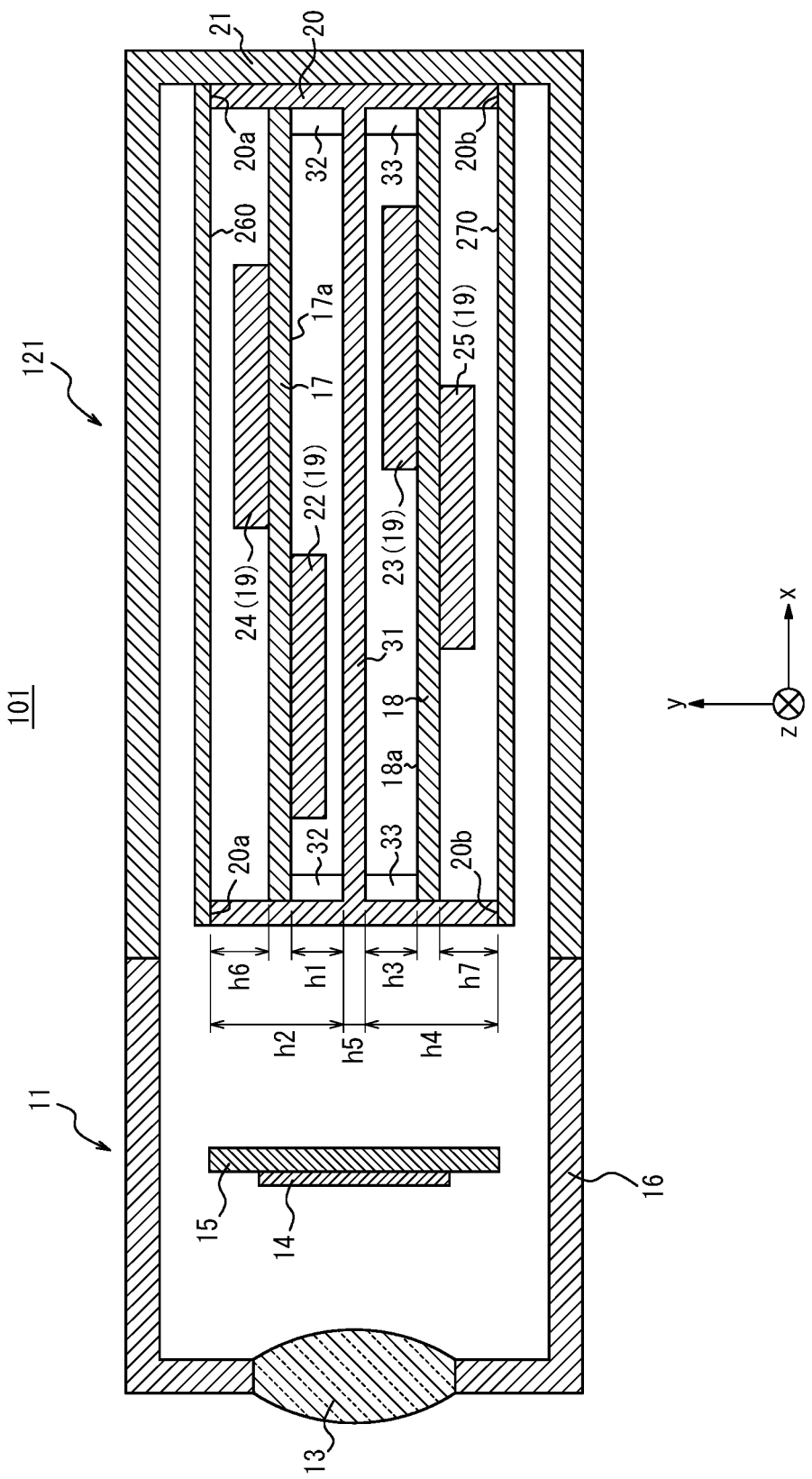
FIG. 8 is a cross-sectional view illustrating an imaging apparatus that includes an electronic apparatus according to a third embodiment.

As illustrated in FIG. 8, the imaging apparatus 101 includes the first electronic apparatus 11 and a second electronic apparatus (electronic apparatus) 121. The first electronic apparatus 11 has the same configuration and function as those of the first embodiment.

The second electronic apparatus 121 includes the first circuit board 17, the second circuit board 18, one or more electronic components 19, the enclosure portion 20, and the second housing 21. The structures and functions of the first circuit board 17, the second circuit board 18, the electronic components 19, the enclosure portion 20, and the second housing 21 of the second electronic apparatus 121 are the same as those of the first embodiment. The second electronic apparatus 121 further includes first convex support portions 32 and second convex support portions 33. The second electronic apparatus 121 may further include a first shield portion 260, a second shield portion 270, and the partition wall 31. The partition wall 31 is the same as that of the second embodiment.

Figure 9:
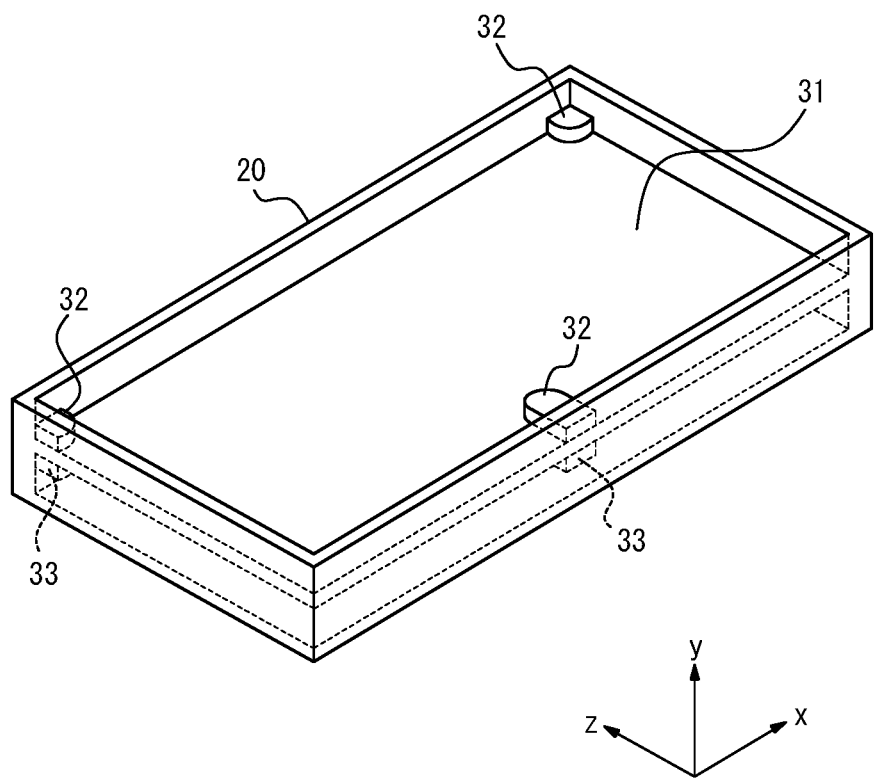
FIG. 9 is a perspective view illustrating an enclosure portion, a partition wall, and first convex support portions illustrated in FIG. 8.

As illustrated in FIG. 9, the first convex support portions 32 are arranged in the space enclosed by the enclosure portion 20. The first convex support portions 32 are arranged on one side of the partition wall 31. Each of the first convex support portions 32 may be formed by a single member integrally formed with the partition wall 31. The partition wall 31 may be configured as a member separate from the enclosure portion 20 and fixed to the enclosure portion 20.

The second electronic apparatus 121 has three first convex support portions 32. In this configuration, the three first convex support portions 32 are arranged in such a manner that one of them deviates from a straight line connecting the other two of the first convex support portions 32. For example, the first convex support portions 32 is arranged at each of two adjacent corners of a rectangle enclosed by the enclosure portion 20 and a position on a side opposite from a side located between the two adjacent corners. Each of the three first convex support portions 32 has a flat surface on its side for supporting the first circuit board 17. Each of the three first convex support portions 32 fixes the first circuit board 17 on the flat surface. In this way, the three first convex support portions 32 support the first circuit board 17 within a plane including end portions of the three first convex support portions 32.

The second electronic apparatus 121 may include one first convex support portion 32. In a configuration in which the second electronic apparatus 121 includes one first convex support portion 32, the first convex support portion 32 has a plane perpendicular to the axial direction (the y-direction in FIG. 9) of the enclosure portion 20. The first convex support portion 32 supports the first circuit board 17 by fixing it to the plane. The number of the first convex support portions 32 included in the second electronic apparatus 121 may be two, four, or more.

As illustrated in FIG. 8, an axial height h1 of the first convex support portion 32 is less than a height h2 from the partition wall 31 to the end surface 20a in the axial direction of the enclosure portion 20.

The second convex support portions 33 have a function and a configuration that are similar to those of the first convex support portion 32. The second convex support portions 33 are different from the first convex support portions 32, in terms of being arranged on the surface of the partition wall 31 on the opposite side from the surface on which the first convex support portion 32 is arranged. A height h3 in the axial direction of the first convex support portion 32 is lower than a height h4 from the partition wall 31 to the axial end surface 20a of the enclosure portion 20, in a manner similar to the first convex support portion 32.

In this configuration, the first convex support portion 32 and the second convex support portion 33 support the first circuit board 17 and the second circuit board 18 with a predetermined gap therebetween, in such a manner that one surface of the first circuit board 17 and one surface of the second circuit board 18 oppose each other. The predetermined gap is a sum of the height h1 of the first convex support portion 32, the height h3 of the second convex support portion 33, and a thickness h5 of the partition wall 31.

The first shield portion 260 and the second shield portion 270 can improve the electromagnetic compatibility of the third electronic component 24 and the fourth electronic component 25, respectively, in a manner similar to the first embodiment. The first shield portion 260 can be fixed to the end surface 20a of the enclosure portion 20. The second shield portion 270 can be fixed to the end surface 20b of the enclosure portion 20. The first shield portion 260 and the second shield portion 270 are, for example, plate-like members. In particular, each of the first shield portion 260 and the second shield portion 270 has a rectangular shape. In a configuration in which a height h6 of the enclosure portion 20 from the surface not opposing the partition wall 31 of the first circuit board 17 to the end surface 20a in the axial direction is higher than an axial height of the third electronic component 24, the first shield portion 260 can shield the third electronic component 24. In a configuration in which a height h7 of the enclosure portion 20 from the surface not opposing the partition wall 31 of the second circuit board 18 to the end surface 20b in the axial direction is higher than an axial height of the fourth electronic component 25, the second shield portion 270 can shield the fourth electronic component 25.

According to the third embodiment, as described above, in the second electronic apparatus 121 at least one of the electronic components 19 is provided on at least one of the first opposing surface 17a and the second opposing surface 18a, in a manner the same as the first embodiment. In the second electronic apparatus 121, also, the enclosure portion 20 contacts the second housing 21 and, simultaneously, encloses a space that includes one or more electronic components 19 in the space between the first circuit board 17 and the second circuit board 18. Thus, the second electronic apparatus 121 can improve the heat dissipation effectiveness for heat radiated from the electronic component 19. Further, the second electronic apparatus 121 can improve the heat dissipation effectiveness with a smaller number of elements than that of a case in which a heat absorbing member is provided for each of the electronic components 19 mounted on the two circuit boards.

Next, an imaging apparatus 102 according to a fourth embodiment of the present disclosure will be described. The fourth embodiment will be described below, focusing on its features which differ from those of the first embodiment. Components having the same configurations as those of the first embodiment are denoted by the same reference numerals.

Figure 10:
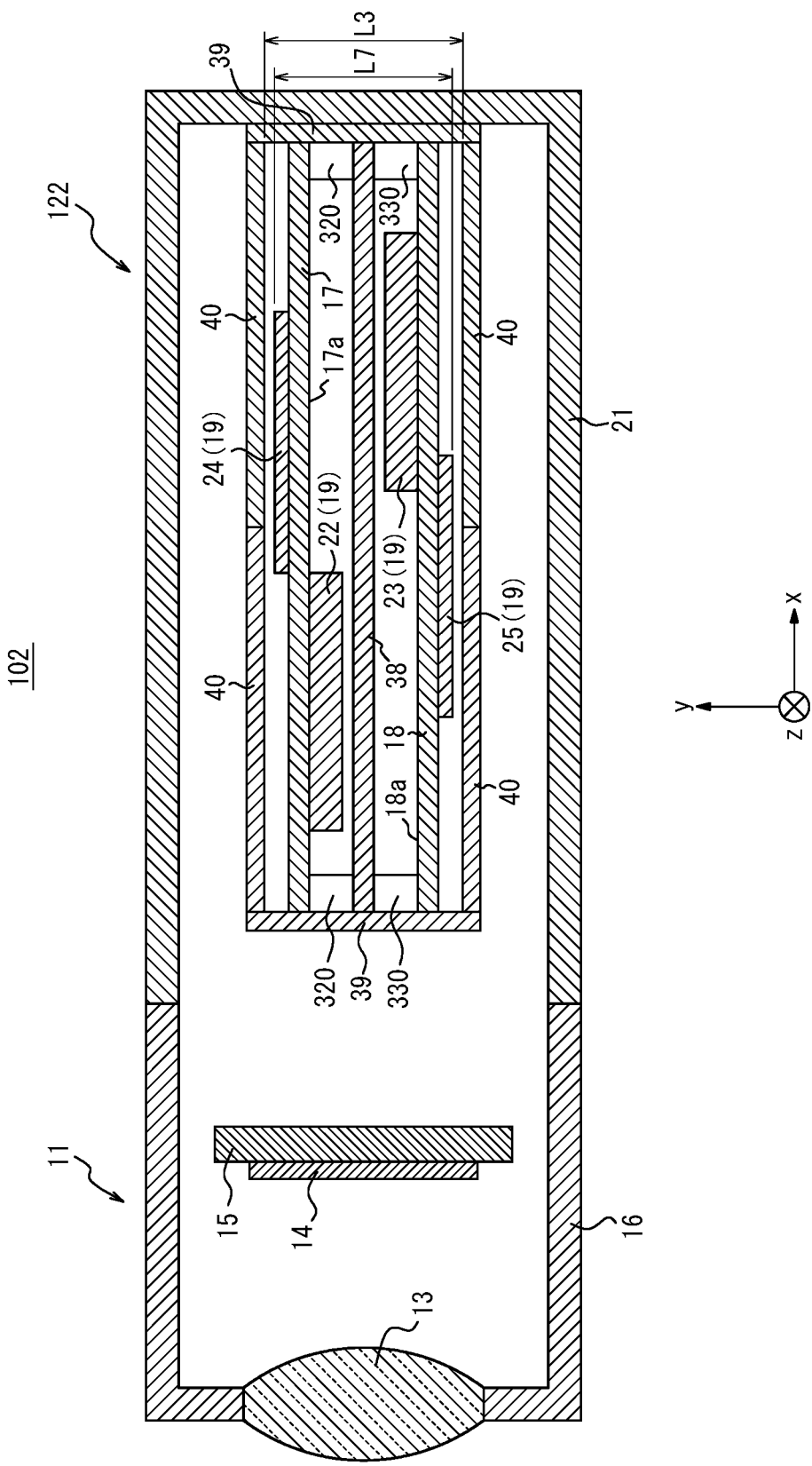
FIG. 10 is a cross-sectional view illustrating an imaging apparatus that includes an electronic apparatus according to a fourth embodiment.

As illustrated in FIG. 10, the imaging apparatus 102 includes the first electronic apparatus 11 and a second electronic apparatus (electronic apparatus) 122. The first electronic apparatus 11 has the same configuration and function as that of the first embodiment.

The second electronic apparatus 122 includes the first circuit board 17, the second circuit board 18, one or more electronic components 19, and the second housing 21. The configurations and functions of the first circuit board 17, the second circuit board 18, the electronic components 19, and the second housing 21 of the second electronic apparatus 122 are the same as those of the first embodiment. The second electronic apparatus 122 further includes a first shield portion 35, two second shield portions 36, a first convex support portion 320, and a second convex support portion 330.

Figure 11:
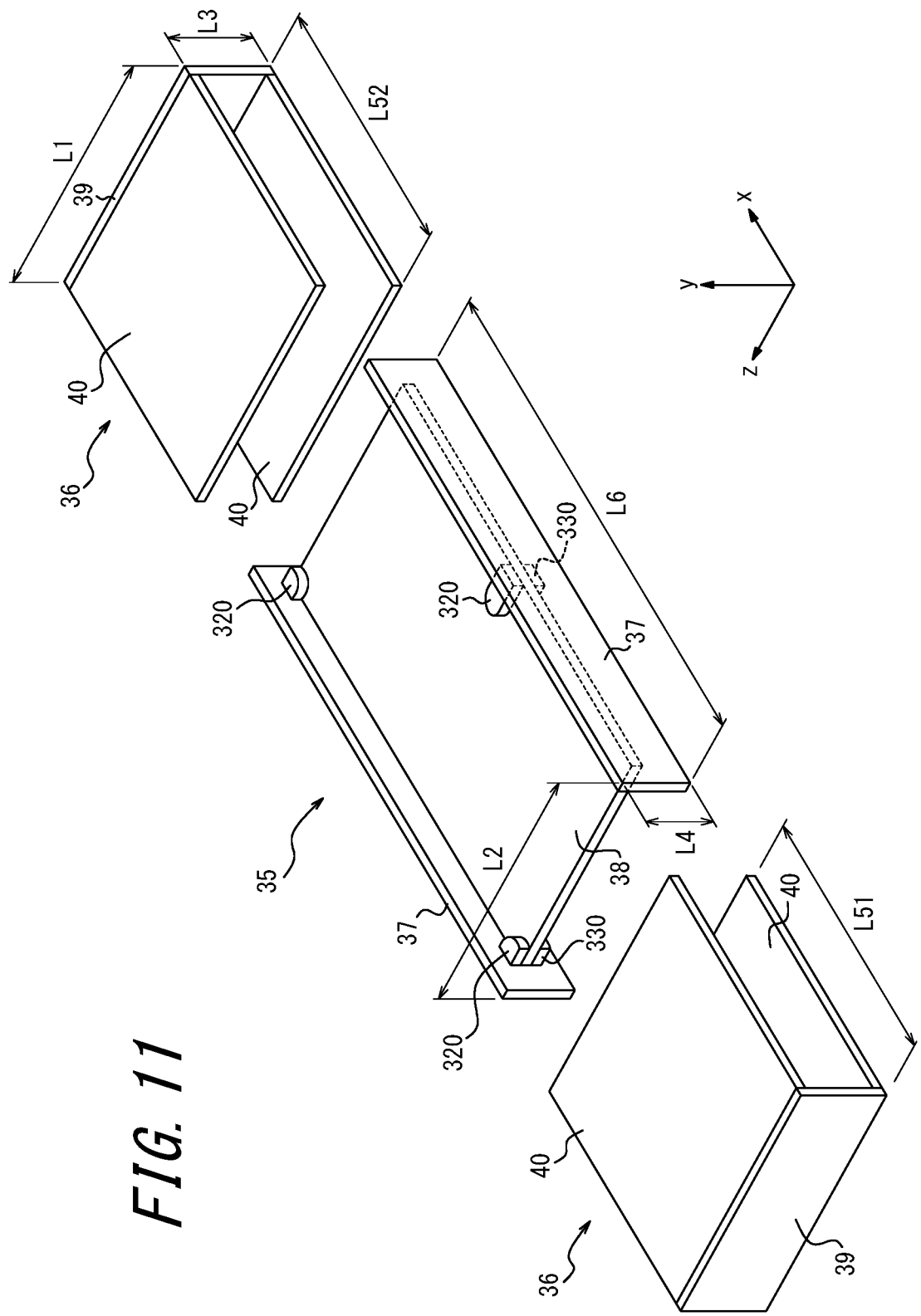
FIG. 11 is an exploded perspective view illustrating a portion of an electronic apparatus that includes a portion illustrated in FIG. 10.

As illustrated in FIG. 11, the first shield portion 35 has two first wall portions 37 and a connection portion 38.

Each of the first wall portions 37 is, for example, a plate-like member. In particular, each of the first wall portions 37 has a rectangular shape. A longitudinal length (in the x-direction in FIG. 11) of each of the first wall portions 37 is equal to or longer than a length of a first side of each of the surfaces of the first circuit board 17 and the second circuit board 18. The first wall portions 37 may have heat conductivity. The first wall portions 37 may have electrical conductivity. For example, the first wall portions 37 may be formed from a metal material.

The connection portion 38 supports the two first wall portions 37 with a predetermined gap therebetween. The connection portion 38 supports the two first wall portions 37 such that they are in parallel with each other. The predetermined gap is equal to or longer than a length of a second side orthogonal to the first side of each of the surfaces of the first circuit board 17 and the second circuit board 18. The connection portion 38 is, for example, a plate-like member. In particular, the connection portion 38 has a rectangular shape. The partition wall 31 of the second embodiment may be adopted as the connection portion 38. Although in the example illustrated in FIG. 11 the connection portion 38 fixes each of the two first wall portions 37 substantially over the entire longitudinal direction of the two first wall portions 37, the connection portion 38 may fix the first wall portions 37 in portions thereof.

The first convex support portion 320 and the second convex support portion 330 are arranged in a space enclosed by the first wall portions 37 and the second wall portion 39, which will be described later. The first convex support portion 320 and the second convex support portion 330 have the same functions and structures as those of the third embodiment. The first convex support portion 320 and the second convex support portion 330 may be integrally formed with the first shield portion 35, or may be formed by members different from a member of the first shield portion 35 and fixed to the first shield portion 35. In the example illustrated in FIG. 10, the first convex support portion 320 and the second convex support portion 330 are formed by members different from the member of the first shield portion 35.

Each of the second shield portions 36 has a second wall portion 39 and two bottom surfaces 40.

The second wall portion 39 is, for example, a plate-like member. In particular, the second wall portion 39 has a rectangular shape. A longitudinal length L1 (in the z-direction in FIG. 11) of the second wall portion 39 is equal to or longer than a distance L2 between the two first wall portions 37 fixed to the connection portion 38. A transverse length L3 (in the y-direction in FIG. 11) of the second wall portion 39 is equal to a length L4 of the first wall portion 37 extending in the direction (the y-direction in FIG. 11) orthogonal to the longitudinal direction of the first wall portion 37. The second wall portion 39 may have heat conductivity. The second wall portions 39 may have electrical conductivity. For example, the second wall portions 39 may be formed from a metal material.

The bottom surface 40 is, for example, a plate-like member. In particular, the bottom surface 40 has a rectangular shape. The two bottom surfaces 40 can improve the electromagnetic compatibility of the electronic components 19 arranged in the vicinity of the bottom surfaces 40. The two bottom surfaces 40 are vertically provided on the longitudinal sides of the second wall portions 39 in a manner perpendicular to the plate surface of the second wall portions 39. In each of the bottom surfaces 40 of the two second shield portions 36, a sum of lengths L51 and L52 in the direction (in the x-direction in FIG. 11) normal to the surface of the second wall portion 39 is equal to or longer than a length L6 of the longitudinal direction of the first wall portion 37 (in the x-direction in FIG. 11). The bottom surfaces 40 may have electrical conductivity. For example, the bottom surfaces 40 may be formed from a metal material.

The first shield portion 35 is fitted into the space between the two bottom surfaces 40 of the second shield portion 36. The first shield portion 35 is fitted into the second shield portion 36 in such a manner that the two first wall portions 37 are perpendicular to the second wall portions 39 and the bottom surfaces 40. The first shield portion 35 is fitted into each of the two second shield portions 36 in such a manner that the second wall portions 39 of the two second shield portions 36 oppose each other.

In a state in which the first shield portion 35 is fitted into the two second shield portions 36, the two first wall portions 37 and the second wall portions 39 together form an enclosure portion that has a rectangular tube shape framing a rectangular flat plate and surrounds the electronic components 19.

As illustrated in FIG. 10, the length L3 between the two bottom surfaces 40 is longer than a length L7 in the axial direction of a structure formed when the electronic components 19 are mounted on each of the first circuit board 17 and the second circuit board 18 fixed to the first shield portion 35. The third electronic component 24 is surrounded by one of the bottom surfaces 40 of each of the two shield portions 36, the first wall portions 37, and the second wall portions 39. Similarly, the fourth electronic component 25 is surrounded by the other one of the bottom surfaces 40 of each of the two second shield portions 36, the first wall portions 37, and the second wall portions 39.

According to the fourth embodiment, as described above, in the second electronic apparatus 122 at least one of the electronic components 19 is provided on at least one of the first opposing surface 17a and the second opposing surface 18a, in the same manner as the first embodiment. Also, the enclosure portion 20 formed by the first wall portions 37 and the second wall portions 39 contacts the second housing 21 and, simultaneously, encloses a space that includes one or more electronic components 19 within the space between the first circuit board 17 and the second circuit board 18. Thus, the second electronic apparatus 122 can improve the heat dissipation effectiveness for heat generated by the electronic components 19. Further, the second electronic apparatus 122 can improve the heat dissipation effectiveness with a smaller number of elements than that of a case in which a heat absorbing member is provided for each of the electronic components 19 mounted on the two circuit boards.

Next, an imaging apparatus 103 according to the fifth embodiment of the present disclosure will be described. The fifth embodiment will be described below, focusing on its features which differ from those of the fourth embodiment. Components having the same configurations as those of the fourth embodiment are denoted by the same reference numerals.

Figure 12:
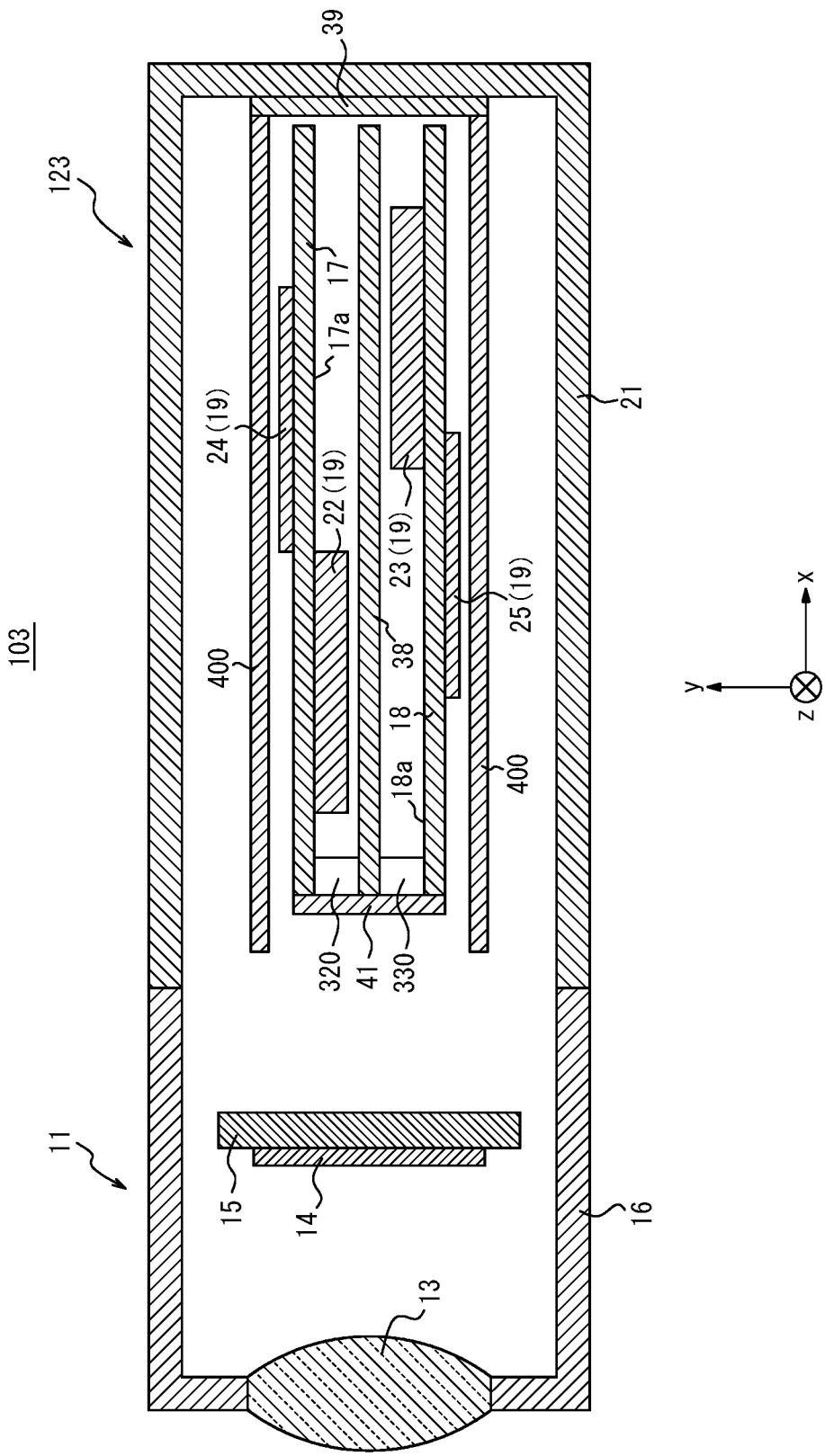
FIG. 12 is a cross-sectional view illustrating an imaging apparatus that includes an electronic apparatus according to a fifth embodiment.

As illustrated in FIG. 12, the imaging apparatus 103 includes the first electronic apparatus 11 and a second electronic apparatus (an electronic apparatus) 123. The first electronic apparatus 11 has the same configuration and function as those of the fourth embodiment.

The second electronic apparatus 123 includes the first circuit board 17, the second circuit board 18, one or more electronic components 19, the second housing 21, a first convex support portion 320, and a second convex support portion 330. The configurations and functions of the first circuit board 17, the second circuit board 18, the electronic components 19, the second housing 21, the first convex support portion 320, and the second convex support portion 330 of the second electronic apparatus 123 are the same as those of the fourth embodiment. The second electronic apparatus 123 further includes a first shield portion 350 and a second shield portion 360.

Figure 13:
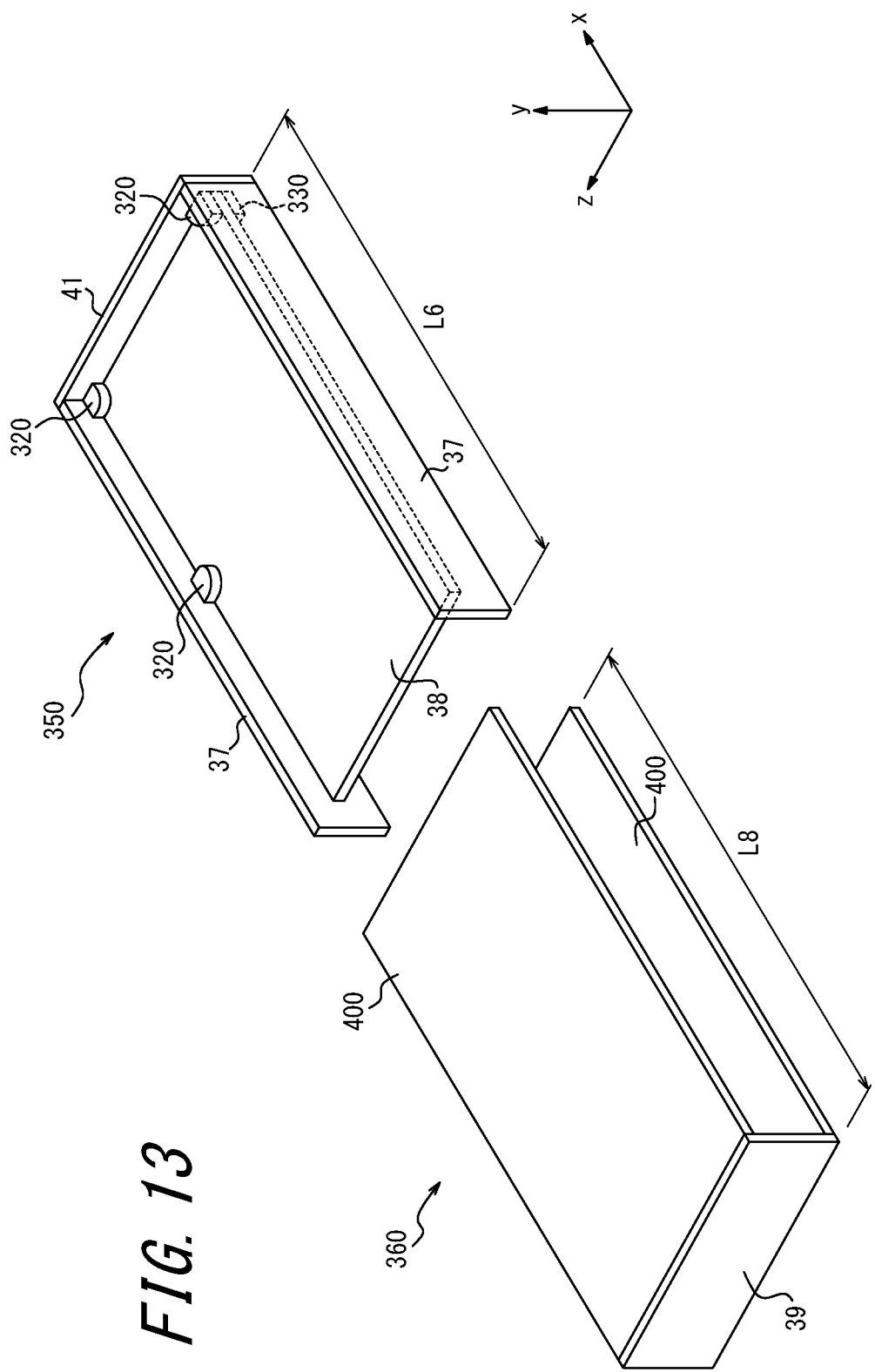
FIG. 13 is an exploded perspective view illustrating a portion of an electronic apparatus that includes a portion illustrated in FIG. 12.

As illustrated in FIG. 13, the first shield portion 350 has two first wall portions 37 and a connection portion 38. The first shield portion 350 also has a third wall portion 41. The functions and structures of the two first wall portions 37 and the connection portion 38 are the same as those of the fourth embodiment.

The third wall portion 41 is, for example, a plate-like member. In particular, the third wall portion 41 has a rectangular shape. The third wall portion 41 is vertically fixed to one end surface in the longitudinal direction (the x-direction in FIG. 13) of each of the two first wall portions 37. The third wall portion 41 may have heat conductivity. The third wall portion 41 may have electrical conductivity. For example, the third wall portion 41 may be formed from a metal material.

The second shield portion 360 has the second wall portion 39 and two bottom surfaces 400. The second wall portion 39 has the same configuration and function as those of the fourth embodiment.

Each of the bottom surfaces 400 is a rectangular plate-like member. In particular, each of the bottom surfaces 400 has a rectangular shape. The two bottom surfaces 400 are provided vertical to the longitudinal sides of the second wall portion 39. A length L8 of the bottom surface 400 normal to the second wall portion 39 (in the x-direction in FIG. 13) is equal to or longer than the length L6 in the longitudinal direction (in the x-direction in FIG. 13) of the first wall portion 37. The bottom surfaces 400 may have electrical conductivity. For example, each of the bottom surfaces 400 may be formed from a metal material.

The first shield portion 350 is fitted into the space between the two bottom surfaces 400 of the second shield portion 360. In the first shield portion 350, the two first wall portions 37 are perpendicular to each of the second wall portion 39 and the bottom surfaces 400, and the first shield portion 350 is fitted into the second shielding portion 360 in such a manner that the third wall portion 41 opposes the second wall portion 39.

In a state in which the first shield portion 350 is fitted in the second shield portion 360, the first wall portions 37, the second wall portion 39, and the third wall portion 41 together form an enclosure portion that has a rectangular tube shape that frames a rectangular flat plate and surrounds the electronic components 19.

According to the fifth embodiment, as described above, in the second electronic apparatus 123 at least one of the electronic components 19 is provided on at least one of the first opposing surface 17a and the second opposing surface 18a, in the same manner as the first embodiment. Also, the enclosure portion formed by the first wall portions 37, the second wall portion 39, and the third wall portion 41 contacts the second housing 21 and, simultaneously, encloses the space that includes one or more electronic components 19 within the space between the first circuit board 17 and the second circuit board 18. Thus, the second electronic apparatus 123 can improve the heat dissipation effectiveness for heat generated by the electronic component 19. Further, the second electronic apparatus 123 can improve the heat dissipation effectiveness with a smaller number of elements than that of a case in which a heat absorbing member is provided for each of the electronic components 19 mounted on the two circuit boards.

Next, an imaging apparatus 104 according to a sixth embodiment of the present disclosure will be described. The sixth embodiment will be described below, focusing on its features which differ from those of the first embodiment. Components having the same configurations as those of the first embodiment are denoted by the same reference numerals.

Figure 14:
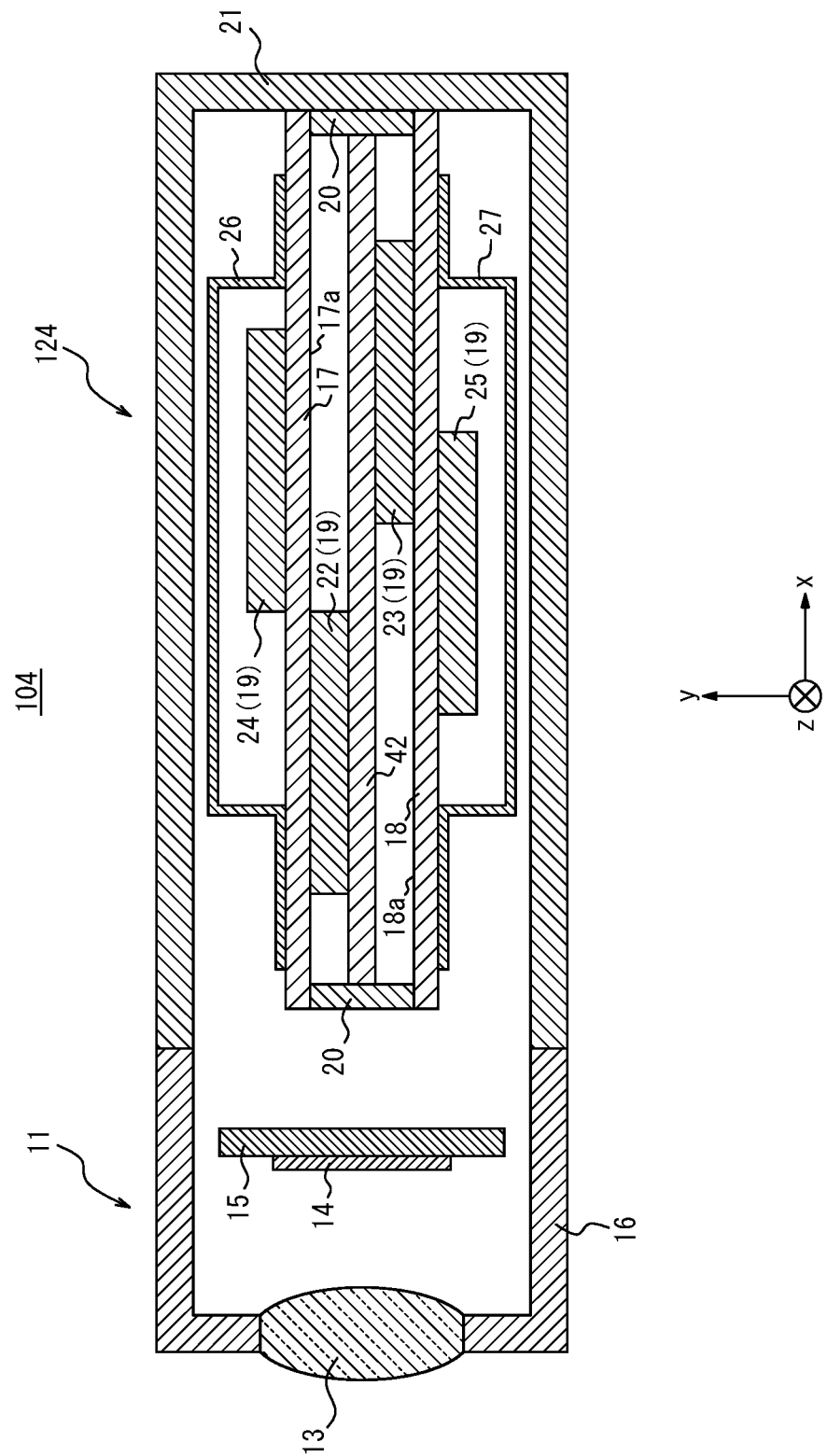
FIG. 14 is a cross-sectional diagram illustrating an imaging apparatus that includes an electronic apparatus according to a sixth embodiment.

As illustrated in FIG. 14, the imaging apparatus 104 includes the first electronic apparatus 11 and a second electronic apparatus (an electronic apparatus) 124. The first electronic apparatus 11 has the same configuration and function as those of the first embodiment.

The second electronic apparatus 124 includes the first circuit board 17, the second circuit board 18, one or more electronic components 19, the enclosure portion 20, and the second housing 21. The configurations and functions of the first circuit board 17, the second circuit board 18, the electronic components 19, the enclosure portion 20, and the second housing 21 of the second electronic apparatus 124 are the same as those of the first embodiment. The second electronic apparatus 124 further includes a heat conductor 42.

The heat conductor 42 is fixed in a manner so as to contact at least one of the first electronic component 22 and the second electronic component 23. The heat conductor 42 is fixed in a manner so as to contact the enclosure portion 20. The heat conductor 42 is, for example, a plate-like member. In particular, the heat conductor 42 has a rectangular shape. The heat conductor 42 is arranged in parallel with the first circuit board 17 and the second circuit board 18. The heat conductor 42 may be integrally formed with the enclosure portion 20. The partition wall 31 may be formed by a member different from a member of the enclosure portion 20 and fixed to the enclosure portion 20. In the example illustrated in FIG. 10, the heat conductor 42 is formed by a member different from the member of the enclosure portion 20.

According to the sixth embodiment, as described above, in the second electronic apparatus 124 at least one of the electronic components 19 is provided on at least one of the first opposing surface 17a and the second opposing surface 18a, in the same manner as the first embodiment. Also, the enclosure portion 20 contacts the second housing 21 and, simultaneously, encloses the space that includes one or more electronic components 19 within the space between the first circuit board 17 and the second circuit board 18. Thus, the second electronic apparatus 124 can improve the heat dissipation effectiveness for heat generated by the electronic components 19. Further, the second electronic apparatus 124 can improve the heat dissipation effectiveness with a smaller number of elements than that of a case in which a heat absorbing member is provided for each of the electronic components 19 mounted on the two circuit boards.

According to the sixth embodiment, the second electronic apparatus 124 includes the first electronic component 22, the second electronic component 23, and the heat conductor 42 that contacts the enclosure portion 20. In the second electronic apparatus 124, thus, the heat conductor 42 efficiently conducts heat generated by the first electronic component 22 to the enclosure portion 20. Accordingly, the second electronic apparatus 124 can efficiently conduct heat generated by the first electronic component 22 to the second housing 21 for dissipation via the heat conductor 42.

Although the above embodiments have been described as representative examples, it will be apparent to those skilled in the art that numerous modifications and substitutions can be made within the spirit and scope of the present disclosure. Accordingly, the present disclosure should not be construed as being limited by the embodiments described above, and various modifications and changes can be made without departing from the scope of the claims. For example, a plurality of constituent blocks described in the embodiments and examples can be combined, or one constituent block can be subdivided.

The drawings explaining the embodiments described above according to the present disclosure are for illustrative purpose only and are not necessarily drawn to scale.

REFERENCE SIGNS LIST 10, 100, 101, 102, 103, 104 imaging apparatus
11 first electronic apparatus
12, 120, 121, 122, 123, 124 second electronic apparatus (electronic apparatus)
13 imaging optical system
14 image sensor
15 image sensor substrate
16 first housing
17 first circuit board
17a first opposing surface
18 second circuit board
18a second opposing surface
19 electronic component
20 enclosure portion
20a, 20b end surface
21 second housing (housing)
21a inner wall surface
21b opening wall
21c opening
22 first electronic component 23 second electronic component
24 third electronic component
25 fourth electronic component
26 first shield portion
27 second shield portion
28 guide portion
29 fitting portion
30 protrusion
31 partition wall
32, 320 first convex support portion
33, 330 second convex support portion
34, 42 heat conductor
35, 350 first shield portion
36, 360 second shield portion
37 first wall portion
38 connection portion
39 second wall portion
40, 400 bottom portion
41 third wall portion
50 mobile body

The invention claimed is:

1. An electronic apparatus comprising:
a first circuit board and a second circuit board;
one or more electronic components mounted on at least one of opposing surfaces of the first circuit board and the second circuit board;
an enclosure portion configured to support a surface of each of the first circuit board and the second circuit board to oppose each other and to enclose a gap space that includes the one or more electronic components, within the gap space defined by a predetermined gap between the first circuit board and the second circuit board;
a housing configured to accommodate the first circuit board, the second circuit board, and the enclosure portion, the enclosure portion contacting the housing; and
a partition wall that is fixed to the enclosure portion and partitions the gap space into a first circuit board space that includes an electronic component of the one or more electronic components that is mounted on the first circuit board and a second circuit board space that includes an electronic component of the one or more electronic components that is mounted on the second circuit board.

2. The electronic apparatus according to claim 1, wherein the enclosure portion has heat conductivity and electrical conductivity and is grounded to a ground of at least one of the first circuit board and the second circuit board.

3. The electronic apparatus according to claim 1, wherein the one or more electronic components include a first electronic component mounted on the first circuit board and a second electronic component mounted on the second circuit board, and
the first electronic component and the second electronic component are arranged in the gap space in a manner so as to not interfere with each other.

4. The electronic apparatus according to claim 1, wherein the partition wall directly or indirectly contacts the one or more electronic components.

5. The electronic apparatus according to claim 4, further comprising a heat conductor that contacts the partition wall and one of the one or more electronic components.

6. The electronic apparatus according to claim 1, further comprising:
another electronic component mounted on a surface on an opposite side to one of the opposing surfaces of the first circuit board and the second circuit board; and
a shielding portion that shields the another electronic component and fixable to the enclosure portion.

7. An imaging apparatus comprising:
an electronic apparatus that includes:
a first circuit board and a second circuit board;
one or more electronic components mounted on at least one of opposing surfaces of the first circuit board and the second circuit board;
an enclosure portion configured to support a surface of each of the first circuit board and the second circuit board to oppose each other and to enclose a gap space that includes the one or more electronic components, within the gap space defined by a predetermined gap between the first circuit board and the second circuit board;
a housing configured to accommodate the first circuit board, the second circuit board, and the enclosure portion, the enclosure portion contacting the housing; and
a partition wall that is fixed to the enclosure portion and partitions the gap space into a first circuit board space that includes an electronic component of the one or more electronic components that is mounted on the first circuit board and a second circuit board space that includes an electronic component of the one or more electronic components that is mounted on the second circuit board.

8. A mobile body comprising:
an electronic apparatus that includes:
a first circuit board and a second circuit board;
one or more electronic components mounted on at least one of opposing surfaces of the first circuit board and the second circuit board;
an enclosure portion configured to support a surface of each of the first circuit board and the second circuit board to oppose each other and to enclose a gap space that includes the one or more electronic components, within the gap space defined by a predetermined gap between the first circuit board and the second circuit board;
a housing configured to accommodate the first circuit board, the second circuit board, and the enclosure portion, the enclosure portion contacting the housing; and
a partition wall that is fixed to the enclosure portion and partitions the gap space into a first circuit board space that includes an electronic component of the one or more electronic components that is mounted on the first circuit board and a second circuit board space that includes an electronic component of the one or more electronic components that is mounted on the second circuit board.

* * * * *